United States Patent [19]

Picco et al.

[11] Patent Number: 5,930,502
[45] Date of Patent: Jul. 27, 1999

[54] METHOD FOR SHARING A RANDOM-ACCESS MEMORY BETWEEN TWO ASYNCHRONOUS PROCESSORS AND ELECTRONIC CIRCUIT FOR THE IMPLEMENTATION OF THIS METHOD

[75] Inventors: André Picco, Vizille; Patrick Menut, Echirolles, both of France

[73] Assignee: SGS-Thomson Microelectronics S.A., Saint Genis, France

[21] Appl. No.: 08/075,755

[22] Filed: Jun. 11, 1993

[30] Foreign Application Priority Data

Jun. 19, 1992 [FR] France .................................. 92 07507

[51] Int. Cl.[6] ...................................................... G06F 13/36
[52] U.S. Cl. ......................... 395/556; 395/474; 395/559
[58] Field of Search ............................ 364/200 MS File, 364/900 MS File; 395/400, 425, 474, 477, 478, 494, 496, 495, 729, 728, 872, 250, 311, 550, 556, 559, 557

[56] References Cited

U.S. PATENT DOCUMENTS

| | | | |
|---|---|---|---|
| 4,164,787 | 8/1979 | Aranguren | 395/494 |
| 4,594,657 | 6/1986 | Byrns | 395/725 |
| 4,616,310 | 10/1986 | Dill et al. | 395/250 |
| 4,803,618 | 2/1989 | Ita et al. | 395/474 |
| 5,179,665 | 1/1993 | Roslund et al. | 395/250 |
| 5,263,150 | 11/1993 | Chai-I Fan | 395/474 |

FOREIGN PATENT DOCUMENTS

| | | |
|---|---|---|
| A-2053537 | 2/1981 | United Kingdom . |
| WO-A-8604434 | 7/1986 | WIPO . |

*Primary Examiner*—Eddie P. Chan
*Assistant Examiner*—Hiep T. Nguyen
*Attorney, Agent, or Firm*—Wolf, Greenfield & Sacks, P.C.

[57] ABSTRACT

A data processing system includes a shared random-access memory which is shared between a first and second asynchronous processor, wherein an access to the memory is clocked by a clock signal issuing from a first processor. A two-state selection signal is generated having a frequency equal to half the frequency of the clock signal. Access to the memory by the first processor to the memory is enabled when the selection signal is in a first state, and access to the memory by the second processor to the memory is enabled when the selection signal is in a second state. Thus, a memory is shared between two processors of different speeds, the clock signal therefore issuing from the faster processor.

42 Claims, 2 Drawing Sheets

METHOD FOR SHARING A RANDOM-ACCESS MEMORY BETWEEN TWO ASYNCHRONOUS PROCESSORS AND ELECTRONIC CIRCUIT FOR THE IMPLEMENTATION OF THIS METHOD

FIELD OF THE INVENTION

The present invention relates to a method for sharing a random-access memory (RAM) between two asynchronous processors. The invention also concerns an electronic circuit for the implementation of this method.

PRIOR ART

Two general procedures are known for sharing a memory between two processors. The first is the use of a "mailbox" common to both processors, managed by a special software protocol. This procedure is relatively slow and complex. The second procedure is the use of a dual-access memory (dual-port RAM). Such a memory involves the duplication of the switching elements allowing reading or writing in each elementary memory cell, the duplication of the logic for decoding addresses and a logic for managing write conflicts between the two processors. This second procedure has the, advantage of being faster but its implementation is costly owing to the sizeable number of elementary components of the dual-access memory.

SUMMARY OF THE INVENTION

The aim of the present invention is to improve these techniques for exchanging data between two asynchronous processors by providing for a method allowing fast access to the memory from one or the other of the processors, without requiring a very sizeable number of additional components.

The invention thus provides for a method for sharing a random-access memory between first and second asynchronous processors, each of these processors being connected respectively to the memory via a data bus, via an address bus, via a read control line and via a write control line, wherein access to the memory is clocked by a clock signal, wherein a two-state selection signal is generated having a frequency equal to half the frequency of said clock signal, wherein access by the first processor to the memory is enabled when the selection signal is in a first state, and wherein access by the second processor to the memory is enabled when the selection signal is in a second state.

A time-division multiplexing between the two processors is thus effected: access to the memory is granted alternately to the two processors at a rate imposed by the first one's clock. It is unnecessary to double up either the transistors for access to the elementary memory cells or the address decoder of the memory. Furthermore, write conflicts are intrinsically eliminated by the time-division nature of the multiplexing, which avoids provision of priority protocols in the event of conflict.

The method is particularly well suited to the case where one of the processors is substantially faster than the other. This situation is encountered especially when the memory has to be shared between a relatively fast signal processor (DSP) (cycle time typically 60 ns) and a relatively slow general-purpose processor, or microprocessor (cycle time typically 200 ns). The clock signal of the faster processor is then used to clock access to the memory. Under these conditions the faster processor accesses the memory in two cycles so as always to present addresses, data and control signals in phase with the cycle allocated to it. The minimum access time of the slower processor is also twice the cycle time of the faster processor. If the cycle time of the slower processor is at least twice as long as that of the faster processor, access to the memory never slows down the slower processor.

With the method according to the invention, an entirely conventional and non-specific memory plane can be used as the heart of the memory. The associated supervisory logic is also very simple: it is principally a multiplexing. Furthermore, access to the memory is transparent from outside: no special protocol need be obeyed.

The second aspect of the invention concerns an electronic circuit including a random-access memory which can be connected to first and second asynchronous processors via, respectively, two data buses, via two address buses, via two read control lines and via two write control lines, wherein this electronic circuit is configured to receive a clock signal, preferably issuing from the first processor, and to clock access to the memory by this clock signal, and wherein it furthermore comprises access management means for producing a two-state selection signal having a frequency equal to half the frequency of said clock signal, access by the first processor to the memory being enabled when the selection signal is in a first state, and access by the second processor to the memory being enabled when the selection signal is in a second state. This circuit is designed for the implementation of the above method.

Other features and advantages of the invention will become apparent from the following description of a preferred and non-limiting illustrative embodiment, read conjointly with the attached drawings, in which.

Figure 1:
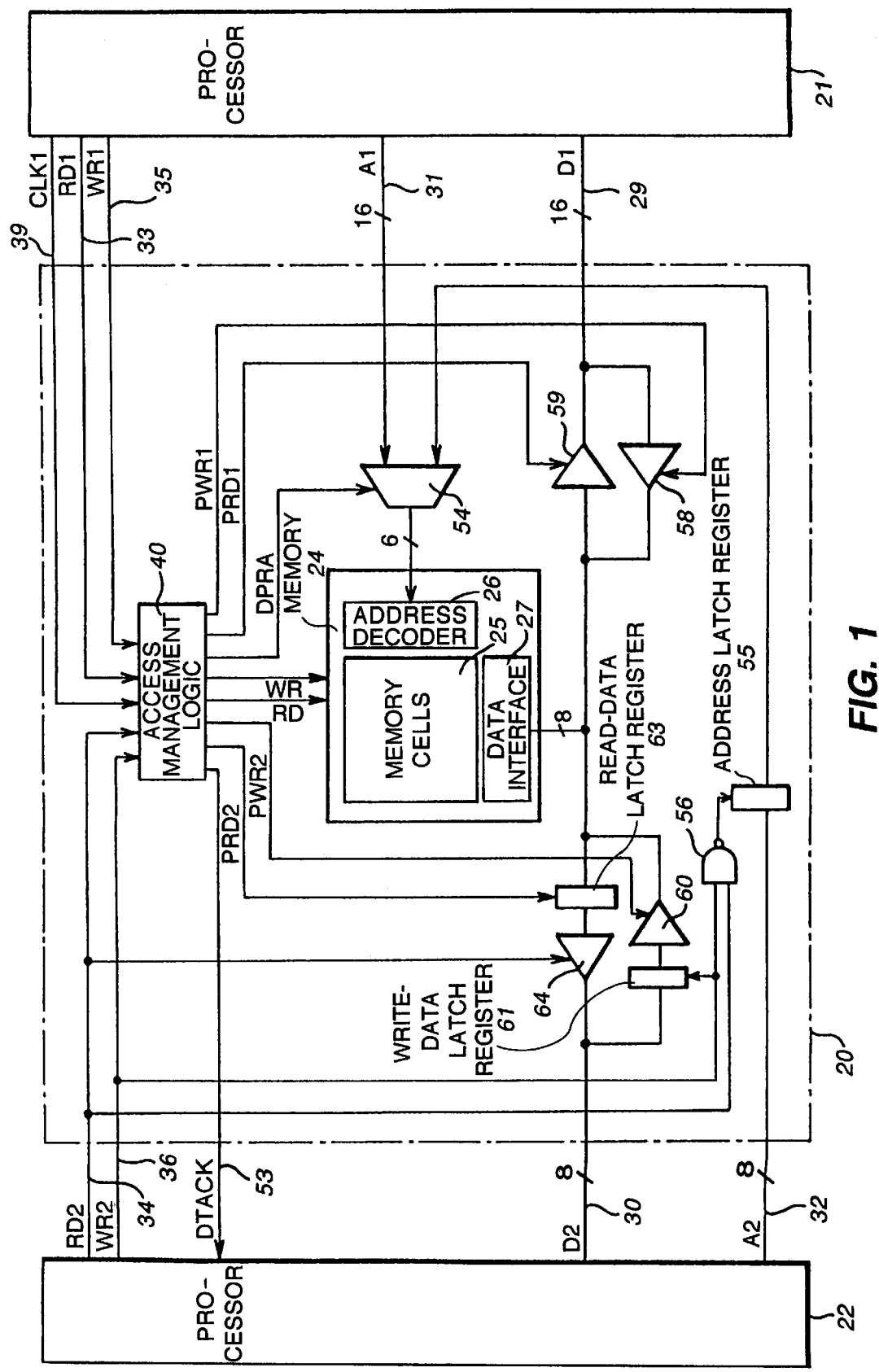
FIG. 1 is a block diagram of an electronic circuit according to the invention.

FIG. 1 shows a circuit 20 according to the invention mounted between two processors 21, 22. The processor 21 is a signal processor (DSP) operating on 16 bits and having a relatively short cycle time (for example 60 ns), and the processor 22 is a general-purpose microprocessor operating on 8 bits and having a relatively long cycle time (for example 200 ns). The two processors are embodied in two distinct integrated-circuit chips. The circuit 20 is preferably contained within the chip of the signal processor 21.

The electronic circuit 20 comprises a random-access memory (RAM) 24 conventionally including a grouping of elementary memory cells 25, an address decoder 26 for selecting the cells where access is required, and a data interface 27 for exchanging data between the cells of the grouping 25 and the outside. In the example represented, the grouping 25 is a 64×8 bit grouping, that is to say requiring 6 address bits and 8 data bits for each data item written into or read from the memory.

Each of the processors 21, 22 is connected to the circuit 20 and to the memory 24 via a bidirectional data bus 29, 30, via an address bus 31, 32, via a read control line 33, 34 and via a write control line 35, 36. In the example represented, the data and address buses of the signal processor 21 are 16-bit buses, whilst those of the microprocessor 22 are 8-bit buses. The control lines 33, 34, 35, 36 carry read or write control signals RD1, RD2, WR1, WR2 which issue from the processors 21, 22 and are active in the 0 logic state and inactive in the 1 logic state.

The signal processor 21 is furthermore connected to the circuit 20 by a clock line 39 on which it delivers its clock signal CLK1 which is used according to the invention to clock access to the memory 24, this clock signal CLK1 serving moreover to clock the operation of the signal processor 21.

Figure 2:
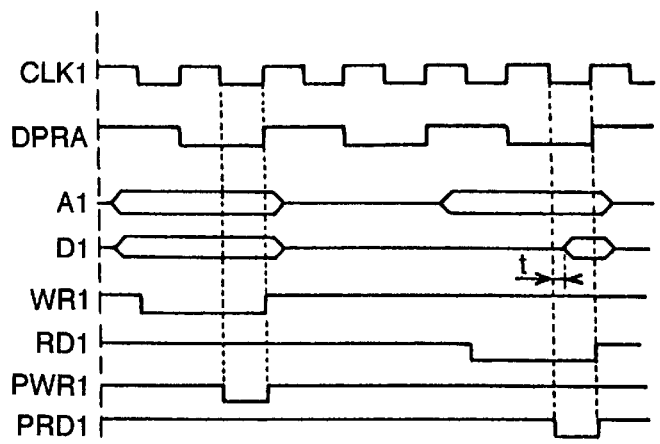
FIGS. 2 and 3 are timing diagrams illustrating the operation of the circuit of FIG. 1.
Figure 3:
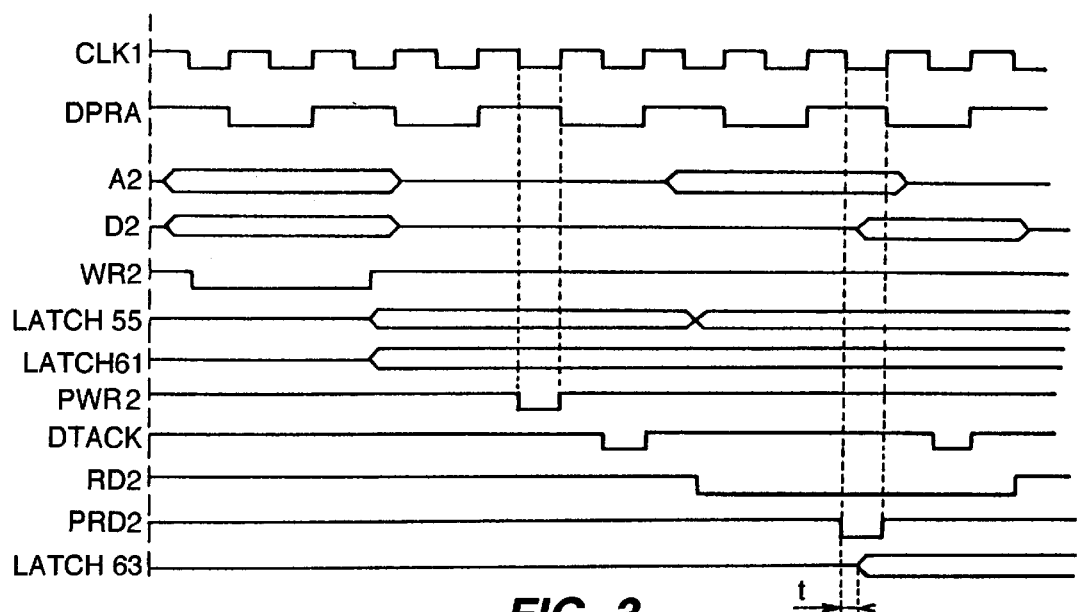

The circuit 20 comprises an access management logic 40 connected to the clock line 39 and to the read and write control lines 33, 34, 35, 36 of the two processors. The access management logic is configured to deliver the following signals:

- a two-state selection signal DPRA having a frequency equal to half that of the clock signal CLK1 (see the first two lines of the timing diagrams of FIGS. 2 and 3);
- a read pulse PRD1 with 0 logic level emitted when the read control signal RD1 is active on the read control line 33 of the processor 21 (RD1=0) and when the selection DPRA and clock CLK1 signals are in the 0 state (FIG. 2);
- a write pulse PWR1 with 0 logic level emitted when the write control signal WR1 is active on the write control line 35 of the processor 21 (WR1=0) and when the selection DPRA and clock CLK1 signals are in the 0 state (FIG. 2);
- a read pulse PRD2 with 0 logic level emitted after the start of the activation of the read control signal RD2 on the read control line 34 of the microprocessor 22 (falling edge of RD2), when the selection signal DPRA is in the 1 state and the clock signal CLK1 in the 0 state (FIG. 3);
- a write pulse PWR2 with 0 logic level emitted after the end of the activation of the write control signal WR2 on the write control line 36 of the microprocessor 22, when the selection signal DPRA is in the 1 state and the clock signal CLK1 in the 0 state (FIG. 3);
- a read pulse RD with 0 logic level addressed to the memory 24 in order to allow read access to the memory 24, this pulse RD being produced at the same time as one of the read pulses PRD1, PRD2;
- a write pulse WR with 0 logic level addressed to the memory 24 in order to allow read access to the memory 24, this pulse WR being produced at the same time as one of the write pulses PWR1, PWR2; and
- an acknowledge pulse DTACK with 0 logic level emitted with a delay equal to one period of the clock signal CLK1 of each read pulse PRD2 and after each write pulse PWR2 (FIG. 3).

Figure 4:
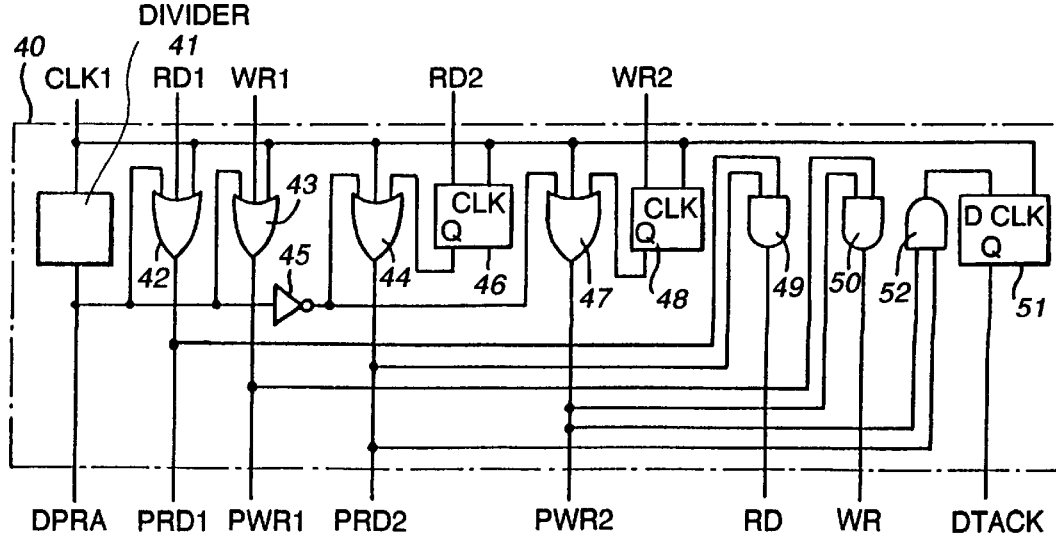
FIG. 4 is a diagram of access management logic means contained within the circuit of FIG. 1.

An illustrative access management logic 40 capable of delivering such signals is illustrated in FIG. 4. The selection signal DPRA is produced as output from a frequency divider 41 receiving the clock signal CLK1. The read pulse PRD1 is produced as output from an OR gate 42 with three inputs receiving the signals DPRA, RD1 and CLK1 respectively. The write pulse PWR1 is produced as output from an OR gate 43 with three inputs receiving the signals DPRA, WR1 and CLK1 respectively. The read pulse PRD2 is produced as output from an OR gate 44 with three inputs respectively receiving the inverse of the signal DPRA (obtained through the inverter 45), the signal CLK1 and a pulse of 0 logic level and of duration equal to two periods of the clock signal CLK1 and delivered by a flip-flop 46 in response to a falling edge of the signal RD2. The write pulse PWR2 is produced as output from an OR gate 47 with three inputs respectively receiving the inverse of the signal DPRA, the signal CLK1 and a pulse of 0 logic level and of duration equal to two periods of the clock signal CLK1 and delivered by a flip-flop 48 in response to a rising edge of the signal WR2. The read pulse RD is produced as output from an AND gate 49 with two inputs respectively receiving the pulse signals PRD1 and PRD2. The write pulse WR is produced as output from an AND gate 50 with two inputs respectively receiving the pulse signals PWR1 and PWR2. The acknowledge pulse DTACK is produced as output from a D-type delay flip-flop 51 driven by the clock signal CLK1, whose input is connected to the output of an AND gate 52 with two inputs respectively receiving the pulse signals PRD2 and PWR2.

The acknowledge pulse signal DTACK is addressed to the microprocessor 22 via an acknowledge line 53 (FIG. 1).

The circuit 20 furthermore comprises an address multiplexer 54 controlled by the selection signal DPRA. The multiplexer 54 has a 16-bit input connected to the address bus 31 of the signal processor 21 and an 8-bit input connected to the address bus 32 of the microprocessor 22 via an address latch register 55. The 6-bit output of the multiplexer 54 is connected to the address decoder 26 of the memory 24. When the selection signal DPRA is in the 0 state, the multiplexer 54 transmits to the decoder 26 the six significant bits of the address A1 presented on the address bus 31 of the processor 21. When the selection signal DPRA is in the 1 state, the multiplexer 54 transmits to the decoder 26 the six significant bits of the address A2 present in the latch register 55.

Thus, the selection signal DPRA enables access by the signal processor 21 to the memory 24 when it is in the 0 state, and access by the microprocessor 22 to the memory 24 when it is in the 1 state.

The addresses A2 presented on the bus 32 of the microprocessor 22 are latched in the register 55 at the end of the activation of the write control signal WR2. To this end, the latch control input of the register 55 is connected to the write control line 36 of the microprocessor 22. This link is made by way of a NAND gate 56, a second input of which is connected to the read control line 34 of the microprocessor 22 so as to preclude an old write address from remaining latched in the register 55 upon a read command. The register 55 is passing when it receives a signal of 0 level from the gate 56 and latches the address A2 which it contains at the time of the rising edge of the signal issuing from the gate 56.

The write pulses PWR1 are addressed to a write buffer 58 mounted between the data bus 29 of the signal processor 21 and the data interface 27 of the memory 24. The buffer 58 is set to low impedance upon a pulse PWR1 of 0 level in order to write into the memory 24 a data item of 8 bits corresponding to the 8 significant bits of the 16-bit data item presented on the bus 29.

Such a write sequence emanating from the processor 21 is illustrated in the left-hand part of FIG. 2. A processor 21 activates its write signal WR1 to 0 for a duration greater than one cycle of its clock signal CLK1, whilst it presents a data item D1 and an address A1 on the buses 29, 31. When the selection signal DPRA becomes equal to 0, the access management logic 40 delivers a write pulse PWR1 at the same time as a write pulse WR addressed to the memory 24. During these two pulses PWR1, WR, the data item D1 is written to the address specified by the multiplexer 54 based on the address A1 presented on the bus 31.

The read pulses PRD1 are addressed to a read buffer 55 mounted between the data interface 27 of the memory 24 and the data bus 29 of the signal processor 21. The buffer 59 is set to low impedance upon a pulse PRD1 of 0 level in order to transmit a data item read from the memory 24 on the data bus 29 (this 8-bit data item may be supplemented with 8 arbitrary bits on the 16-bit bus 29).

Such a read sequence emanating from the processor 21 is illustrated in the right-hand part of FIG. 2. The processor-21 activates its read signal RD1 to 0 for a duration greater than one cycle of its clock signal CLK1, whilst it presents an address A1 on the bus 31. When the selection signal DPRA becomes equal to 0, the access management logic 40 delivers a read pulse PRD1 at the same time as a read pulse RD addressed to the memory 24. During these two pulses PRD1, RD, the data item D1 is read from the memory 24 at the address specified by the multiplexer 54 based on the address A1 presented on the bus 31; then this data item D1 arrives on the data bus 29 of the processor 21 after a time t equal to the time for access to the memory 24.

The write pulses PWR2 are addressed to a write buffer 60 whose output is connected to the data interface 27 of the memory 24 and whose input is connected to a write-data latch register 61 connected to the data bus 30 of the microprocessor 22. The buffer 60 is set to low impedance upon a pulse PWR2 of 0 level in order to write into the memory 24 the 8-bit data item present in the register 61. The latch control input of the register 61 is connected to the write control line 36 of the microprocessor 22. The register 61 is passing when it receives a signal WR2 of 0 level and latches the data item D2 which it contains at the time of the rising edge of the signal WR2. Thus, the data D2 presented on the bus 30 of the microprocessor 22 are latched in the register 61 at the end of the activation of the write control signal WR2 issuing from the microprocessor 22.

A sequence for writing into the memory 24 emanating from the microprocessor 22 is illustrated in the left-hand part of FIG. 3. The microprocessor 22 activates its write control signal WR2 (WR2=0) whilst it presents a data item D2 and an address A2 on the buses 30, 32. At the end of the activation of the write control signal WR2 (rising edge of WR2), the data item D2 is latched in the register 61 and the address A2 is latched in the register 55, as indicated by the lines LATCH 61 and LATCH 55 of FIG. 3. When the selection signal DPRA becomes equal to 1, the access management logic 40 delivers a write pulse PWR2 at the same time as a write pulse WR addressed to the memory 24. During these two pulses PWR2, WR, the data item D2 latched in the register 61 is transmitted and written into the memory 24 at the address specified by the multiplexer 54 based on the address A2 latched in the register 55. This ensures that the written data item emanating from the microprocessor 22 is always the one present on the data bus 30 at the time of the rising edge of the write control signal WR2. After the data item D2 has actually been written, the access management logic delivers an acknowledge pulse DTACK which is communicated to the microprocessor 22 by the acknowledge line 53 in order to indicate thereto that the memory 24 is available for a further access.

The read pulses PRD2 are addressed to the latch control input of a read-data latch register 63 connected to the data interface 27 of the memory 24. The register 63 is passing when the pulse signal PRD2 is at the 0 level and latches the data item which it contains at the time of the rising edge of this signal PRD2. Thus, the data D2 issuing from the memory 24 are latched in the register 63 with each rising edge of the read pulses PRD2. The output of the latch register 63 is connected to the input of a read buffer 64 whose output is connected to the data bus 30 of the microprocessor 22. The buffer 64 is controlled by the read control signal RD2 issuing from the microprocessor 22: when RD2=0, the buffer 64 is at low impedance so as to effect communication between the latch register 63 and the bus 30 and thus transmit the data item present in the register 63 to the microprocessor 22.

A sequence for reading from the memory 24 emanating from the microprocessor 22 is illustrated in the right-hand part of FIG. 3. The microprocessor 22 activates its read control signal RD2 (RD2=0) whilst it presents: an address A2 on the bus 32. Since RD2=0, the NAND gate 56 produces a signal in the 0 state so that the register 55 is passing and the address A2 arrives at the input of the multiplexer 54. When the selection signal DPRA becomes equal to 1, the access management logic 40 delivers a read pulse PRD2 at the same time as a read pulse RD addressed to the memory 24. During these two pulses, the data item D2, read from the memory 24 at the address specified by the multiplexer 54 based on the address A2, appears in the latch register 63 with a delay t equal to the access time to the memory 24 as indicated by the LATCH line 63 of FIG. 3. At the end of the read pulse PRD2 (rising edge of PRD2) the data item D2 is latched in the register 63. After the data item D2 has thus been latched, the access management logic 40 delivers an acknowledge pulse DTACK which is communicated to the microprocessor 22 by the acknowledge line 53. The microprocessor 22 can then maintain activation of its read control signal RD2 during the time required for the actual reception of the data item D2 read. It can then deactivate the signal RD2 to 1 in order to disable its access to the memory 24.

Although the invention has been described with reference to a preferred illustrative embodiment, it will be understood that this example is not limiting and that various modifications may be made thereto without departing from the scope of the invention.

Thus, although the clock signal CLK1 has been described as originating from the signal processor 21, it could also be supplied directly to the circuit 20 by a clock and be transmitted from the circuit 20 to the processor 21, or else arrive in parallel at the circuit 20 and at the processor 21 from the clock.

We claim:

1. A method for sharing a random-access memory between first and second asynchronous processors, each of the processors being connected respectively to the memory via a data bus, via an address bus, via a read control line and via a write control line, the method comprising the steps of:

providing a clock signal to the first asynchronous processor wherein the first asynchronous processor operates at a clock speed that is greater than a clock speed of the second asynchronous processor;

generating a two-state selection signal having a frequency equal to half the frequency of said clock signal;

enabling access by the first processor to the memory when the two-state selection signal is in a first state; and enabling access by the second processor to the memory when the two-state selection signal is in a second state.

2. The method as claimed in claim 1, further comprising the step of controlling an address multiplexer using a selection signal, the address multiplexer having an input connected to the address bus of the first processor, an input connected to the address bus of the second processor, and an output connected to an address decoder of the memory.

3. The method of claim 1, wherein, in order to write a data item into the memory from the second processor, the following steps are performed:

activating a write control signal on the write control line of the second processor;

presenting the data item on the data bus and an address on the address bus of the second processor;

after activating the write control signal, latching the data item into a data latch register and latching the address into an address latch register; and producing a write pulse when the selection signal is in the second state in order to transmit the data item in the data latch register to a location of the memory corresponding to the address in the address latch register.

4. The method as claimed in claim 3, wherein the clock signal is also used to clock the operation of the first processor.

5. The method as claimed in claim 3, further comprising the step of providing an acknowledge signal to the second processor after said write pulse.

6. The method of claim 1, wherein, in order to read a data item in the memory from the second processor, the following steps are performed:

activating the read control signal on the read control line of the second processor;

presenting an address on the address bus of the second processor;

after activating the read control signal, producing a read pulse when the selection signal is in the second state in order to read the data item from a location in the memory that corresponds to the address on the address bus; and at an end of the read pulse, latching the data item into a register, the register communicating with the data bus of the second processor as long as the read control signal is active.

7. The method as claimed in claim 6, further comprising the step of providing an acknowledge signal to the second processor after said read pulse.

8. The method as claimed in 6, wherein the clock signal is also used to clock the operation of the first processor.

9. An electronic circuit including a random-access memory which can be connected to first and second asynchronous processors via, respectively, two data buses, via two address buses, via two read control lines and via two write control lines, wherein the electronic circuit is configured to receive a clock signal and to clock access to the memory by the clock signal, the first asynchronous processor operating at a clock rate of the clock signal wherein the first asynchronous processor operates at a clock rate that is greater than a clock rate of the second asynchronous processor, and wherein the electronic circuit furthermore comprises access management means for producing a two-state selection signal having a frequency equal to half a frequency of said clock signal, access by the first processor to the memory being enabled when the selection signal is in a first state, and access by the second processor to the memory being enabled when the selection signal is in a second state.

10. The electronic circuit as claimed in claim 9, further comprising an address multiplexer having two inputs connected respectively to the two address buses and an output connected to an address decoder of the memory, this address multiplexer being controlled by the selection signal.

11. The electronic circuit as claimed in claim 9, wherein the electronic circuit is contained in an integrated-circuit chip furthermore including the first processor.

12. The electronic circuit of claim 10, wherein an input of the address multiplexer is connected to the address bus of the second processor, via an address latch register, the circuit furthermore comprising a write-data latch register having an input connected to the data bus of the second processor and an output connected to a write buffer, the latching of these two registers being controlled by the end of the activation of a write control signal on the write control line of the second processor, the write buffer being connected to the access management means in order to receive a write pulse generated after the end of the activation of the write control signal on the write control line of the second processor and when the selection signal is in its second state, the write buffer being configured to transmit a data item present in the write-data latch register upon reception of the write pulse.

13. The electronic circuit as claimed in claim 12, wherein the clock signal is received by a clock line issuing from the first processor.

14. The electronic circuit as claimed in claim 13, further comprising an address multiplexer having two inputs connected respectively to the two address buses and an output connected to an address decoder of the memory, this address multiplexer being controlled by the selection signal.

15. The electronic circuit of claim 9, further comprising a read-data latch register having an input connected to the memory and an output connected to the data bus of the second processor via a read buffer, the latching of this register being controlled by the end of a read pulse generated by the access management means after the start of the activation of a read control signal on the read control line of the second processor when the selection signal is in its second state, the read buffer being configured to transmit a data item present in the read-data latch register during the activation of the read control signal.

16. The electronic circuit as claimed in claim 15, wherein the clock signal is received by a clock line issuing from the first processor.

17. A data processing system including a clock signal, comprising:

a random access memory having a data port, an address port, a read control port, and a write control port;

a first processor having a data port, an address port, a read control port and a write control port, the first processor operating at a clock speed of the clock signal;

a second processor operating asynchronously with the first processor and having a data port, an address port, a read control port and a write control port, the second processor operating at a clock speed that is slower than the clock speed of the clock signal;

means responsive to the clock signal for generating a two-state selection signal having a frequency equal to half the frequency of the clock signal;

means for enabling the data port of the first processor to communicate with the data port of the memory when the two-state selection signal is in a first state;

means for enabling the data port of the second processor to communicate with the data port of the memory when the two-state selection signal is in a second state.

18. The system of claim 17, further comprising:

an address multiplexer operating responsive to two-state selection signal, and having a first input connected to receive an address from the address port of the first processor and a second input connected to receive an address from the address port of the second processor and a signal output connected to the address port of the memory.

19. The system of claim 17 wherein the first processor includes means for generating the clock signal.

20. The system of claim 17 wherein the first processor includes:

means for receiving an external clock signal; and means for generating the clock signal from the external clock signal.

21. The data processing system of claim 17 further comprising:

in the second processor, means for asserting a write control signal on the write control port, and means for presenting a data item on the data port;

in the means for enabling the data port of the second processor to communicate means for latching the data item upon the assertion of the write control signal;

means connected for communication between the address port of the second processor and the second input of the address multiplexer, for latching the address upon assertion of the write control signal; and means for producing a write pulse when the two-state selection signal is in the second state, thereby transferring the latched data item to an address in the memory corresponding to the latched address.

22. The system of claim 21, further comprising:

means responsive to the write pulse, for transmitting an acknowledge signal to the second processor.

23. The system of claim 21, wherein the first processor includes means responsive to the clock signal, for controlling the speed of the first processor.

24. The data processing system of claim 17 further comprising:

in the second processor, means for asserting a read control signal on the read control port, and means for presenting a data item on the data port;

in the means for enabling the data port of the second processor to communicate, means for latching the data item upon the assertion of the read control signal;

means connected for communication between the address port of the second processor and the second input of the address multiplexer, for latching the address upon assertion of the read control signal; and means for producing a read pulse when the two-state selection signal is in the second state, thereby transferring the latched data item to an address in the memory corresponding to the latched address.

25. The system of claim 24, further comprising:

means responsive to the read pulse, for transmitting an acknowledge signal to the second processor.

26. The system of claim 24, wherein the first processor includes means responsive to the clock signal, for controlling the speed of the first processor.

27. A method for granting access for a shared memory to a first processor and a second processor, the method comprising the steps of:

operating the first processor at a clock rate of a first clock signal, the clock rate of the first clock signal being greater than a clock rate at which the second processor operates;

assigning a first time period to the first processor, the first time period being every other cycle of the first clock signal;

assigning a second time period to the second processor the second time period being time that does not overlap with the first time period;

granting access to the first processor during the first time period; and granting access to the second processor during the second time period.

28. The method of claim 27, wherein the step of assigning a second time period includes determining the second time period to be all of the time that does not overlap with the first time period.

29. The method of claim 27, wherein the step of granting access to the first processor includes the steps of:

generating a selection signal having a frequency equal to half a frequency of the first clock signal, the selection signal having a first state representing the first time period and a second state representing the second time period;

receiving an access request signal from the first processor; and latching the access request signal from the first processor when the selection signal is in the first state, to generate an access pulse that is provided to the shared memory.

30. The method of claim 29, wherein the step of receiving an access request signal includes receiving a write signal from the first processor, and wherein the step of latching the access request signal includes generating a write pulse that is provided to the shared memory.

31. The method of claim 29, wherein the step of receiving an access request signal includes receiving a read signal from the first processor, and wherein the step of latching the access request signal includes generating a read pulse that is provided to the shared memory.

32. The method of claim 27, wherein the step of granting access to the second processor includes the steps of:

generating a selection signal having a frequency equal to half a frequency of the first clock signal, the selection signal having a first state representing the first time period and a second state representing the second time period;

receiving an access request signal from the second processor; and latching the access request signal from the second processor when the selection signal is in the second state, to generate an access pulse that is provided to the shared memory.

33. The method of claim 32, wherein the step of receiving an access request signal includes receiving a write signal from the second processor, and wherein the step of latching the access request signal includes generating a write pulse that is provided to the shared memory.

34. The method of claim 33, wherein the step of receiving an access request signal includes receiving a read signal from the second processor, and wherein the step of latching the access request signal includes generating a read pulse that is provided to the shared memory.

35. An apparatus for granting access for a shared memory to a first processor and a second processor, the apparatus comprising:

means for operating the first processor at a clock rate of a first clock signal, the clock rate of the first clock signal being greater than a clock rate at which the second processor operates;

means for assigning a first time period to the first processor, the first time period being every other cycle of the first clock signal;

means for assigning a second time period to the second processor, the second time period being time that does not overlap with the first time period;

means for granting access to the first processor during the first time period; and means for granting access to the second processor during the second time period.

36. The apparatus of claim 35, wherein the means for assigning a second time period includes means for determining the second time period to be all of the time that does not overlap with the first time period.

37. The apparatus of claim 35, wherein the means for granting access to the first processor includes:

means for generating a selection signal having a frequency equal to half a frequency of the first clock signal, the selection signal having a first state representing the first time period and a second state representing the second time period;

means for receiving an access request signal from the first processor; and means for latching the access request signal from the first processor when the selection signal is in the first state, to generate an access pulse that is provided to the shared memory.

38. The apparatus of claim 37, wherein the means for receiving an access request signal includes means for receiving a write signal from the first processor, and wherein the means for latching the access request signal includes means for generating a write pulse that is provided to the shared memory.

39. The apparatus of claim 37, wherein the means for receiving an access request signal includes means for receiving a read signal from the first processor, and wherein the means for latching the access request signal includes means for generating a read pulse that is provided to the shared memory.

40. The apparatus of claim 35, wherein the means for granting access to the second processor includes:

means for generating a selection signal having a frequency equal to half a frequency of the first clock signal, the selection signal having a first state representing the first time period and a second state representing the second time period;

means for receiving an access request signal from the second processor; and means for latching the access request signal from the second processor when the selection signal is in the second state, to generate an access pulse that is provided to the shared memory.

41. The apparatus of claim 40, wherein the means for receiving an access request signal includes means for receiving a write signal from the second processor, and wherein the means for latching the access request signal includes means for generating a write pulse that is provided to the shared memory.

42. The apparatus of claim 40, wherein the means for receiving an access request signal includes means for receiving a read signal from the second processor, and wherein the means for latching the access request signal includes means for generating a read pulse that is provided to the shared memory.

* * * * *